(12) United States Patent
Chen et al.

(10) Patent No.: US 11,024,616 B2
(45) Date of Patent: Jun. 1, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Yu-Wei Chen, Hsinchu (TW); Li-Chung Kuo, Taipei (TW); Long-Hua Lee, Taipei (TW); Szu-Wei Lu, Hsinchu (TW); Ying-Ching Shih, Hsinchu (TW); Kuan-Yu Huang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/413,612

(22) Filed: May 16, 2019

(65) Prior Publication Data

US 2020/0365571 A1    Nov. 19, 2020

(51) Int. Cl.
| | |
|---|---|
| *H01L 25/11* | (2006.01) |
| *H01L 23/538* | (2006.01) |
| *H01L 23/498* | (2006.01) |
| *H01L 25/00* | (2006.01) |
| *H01L 23/31* | (2006.01) |
| *H01L 25/10* | (2006.01) |
| *H01L 23/00* | (2006.01) |
| *H01L 21/56* | (2006.01) |
| *H01L 23/29* | (2006.01) |

(52) U.S. Cl.
CPC ........ *H01L 25/115* (2013.01); *H01L 23/3114* (2013.01); *H01L 23/3121* (2013.01); *H01L 23/3128* (2013.01); *H01L 23/49811* (2013.01); *H01L 23/5389* (2013.01); *H01L 25/105* (2013.01); *H01L 25/50* (2013.01); *H01L 21/56* (2013.01); *H01L 21/563* (2013.01); *H01L 23/295* (2013.01); *H01L 23/49816* (2013.01); *H01L 23/538* (2013.01); *H01L 23/562* (2013.01)

(58) Field of Classification Search
CPC ..... H01L 25/115; H01L 25/50; H01L 25/105; H01L 23/3114; H01L 23/5389; H01L 23/49811
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |

(Continued)

*Primary Examiner* — Ahmed N Sefer
(74) *Attorney, Agent, or Firm* — JCIPRNET

(57) ABSTRACT

Provided is a package structure including at least two chips, an interposer, a first encapsulant, and a second encapsulant. The at least two chips are disposed side by side and bonded to the interposer by a plurality of connectors. The first encapsulant is disposed on the interposer and filling in a gap between the at least two chips. The second encapsulant encapsulates the plurality of connectors and surrounding the at least two chips, wherein the second encapsulant is in contact with the first encapsulant sandwiched between the at least two chips, and a material of the second encapsulant has a coefficient of thermal expansion (CTE) larger than a CTE of a material of the first encapsulant. A method of manufacturing a package structure is also provided.

20 Claims, 11 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2006/0054901 A1* | 3/2006 | Shoji | H01L 21/565 257/80 |
| 2009/0206462 A1* | 8/2009 | Onodera | H01L 21/56 257/686 |
| 2014/0131856 A1* | 5/2014 | Do | H01L 23/3128 257/737 |
| 2015/0255361 A1* | 9/2015 | Lee | H01L 23/5383 257/738 |
| 2016/0056055 A1* | 2/2016 | Ko | H01L 23/5384 438/107 |
| 2016/0300813 A1* | 10/2016 | Zhai | H01L 24/19 |
| 2017/0287871 A1* | 10/2017 | Lu | H01L 21/568 |
| 2017/0365591 A1* | 12/2017 | Chang | H01L 23/3135 |
| 2018/0005919 A1* | 1/2018 | Chen | H01L 24/97 |
| 2018/0047653 A1* | 2/2018 | Costa | H01L 23/34 |
| 2018/0130749 A1* | 5/2018 | Tsai | H01L 21/56 |
| 2018/0138101 A1* | 5/2018 | Yu | H01L 23/481 |
| 2018/0138116 A1* | 5/2018 | Lin | H01L 21/4853 |
| 2018/0261573 A1* | 9/2018 | Chen | H01L 23/562 |
| 2019/0006291 A1* | 1/2019 | Neal | H01L 25/105 |
| 2019/0013276 A1* | 1/2019 | Lee | H01L 21/56 |
| 2019/0172791 A1* | 6/2019 | Kawabata | H01L 21/486 |
| 2020/0006181 A1* | 1/2020 | Chen | H01L 24/19 |

\* cited by examiner

PACKAGE STRUCTURE AND METHOD OF MANUFACTURING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is a Chip-On-Wafer-On-Substrate (CoWoS) technology, where a semiconductor chip is attached to a wafer (e.g., an interposer) to form a Chip-On-Wafer (CoW) structure. The CoW structure is then attached to a substrate (e.g., a printed circuit board) to form a CoWoS structure and provide a high level of integration and component density. The CoWoS technology generally enables production of semiconductor devices with enhanced functionalities and small footprints. However, there are quite a few challenges to be handled for the CoWoS technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
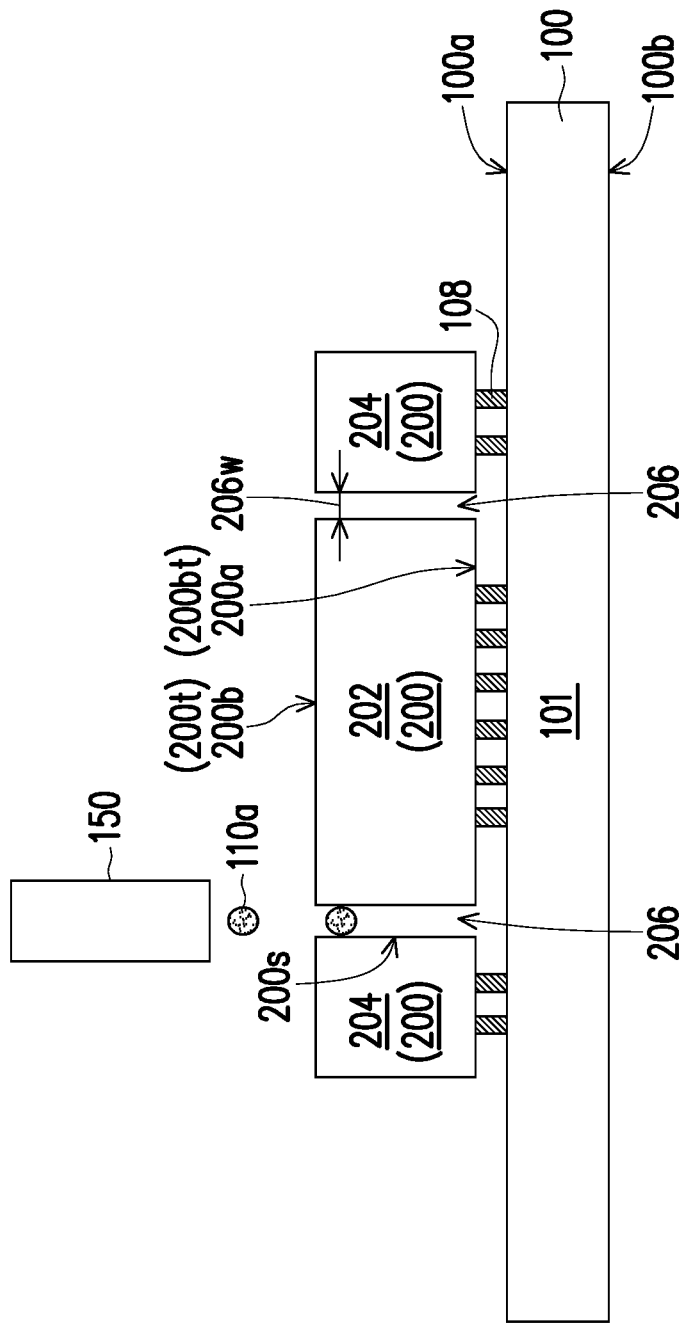
FIG. 1A to FIG. 1E are cross-sectional views of a method of forming a package structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely a package structure including a first encapsulant with a lower coefficient of thermal expansion (CTE) that fills in a gap between at least two chips, so as to reduce the warpage of the package structure resulting from the CTE mismatch. This reduction of the warpage of the package structure enables a more reliable package structure by reducing the likelihood of cold joints between the interposer and the circuit substrate.

Embodiments will be described with respect to a specific context, namely a Chip-Interposer-Substrate stacked package using Chip-on-Wafer-on-Substrate (CoWoS) processing. Other embodiments may also be applied, however, to other packages, such as a Die-Die-Substrate stacked package, a Package-Interposer-substrate, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1A to FIG. 1E are cross-sectional views of a method of forming a package structure in accordance with a first embodiment.

Figure 1B:
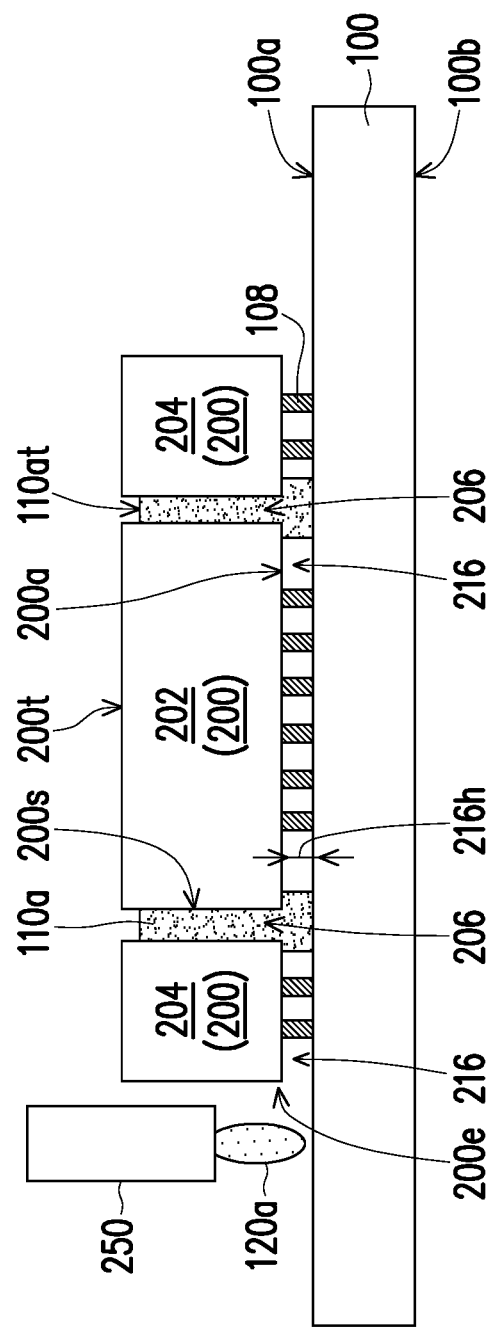
Figure 1C:
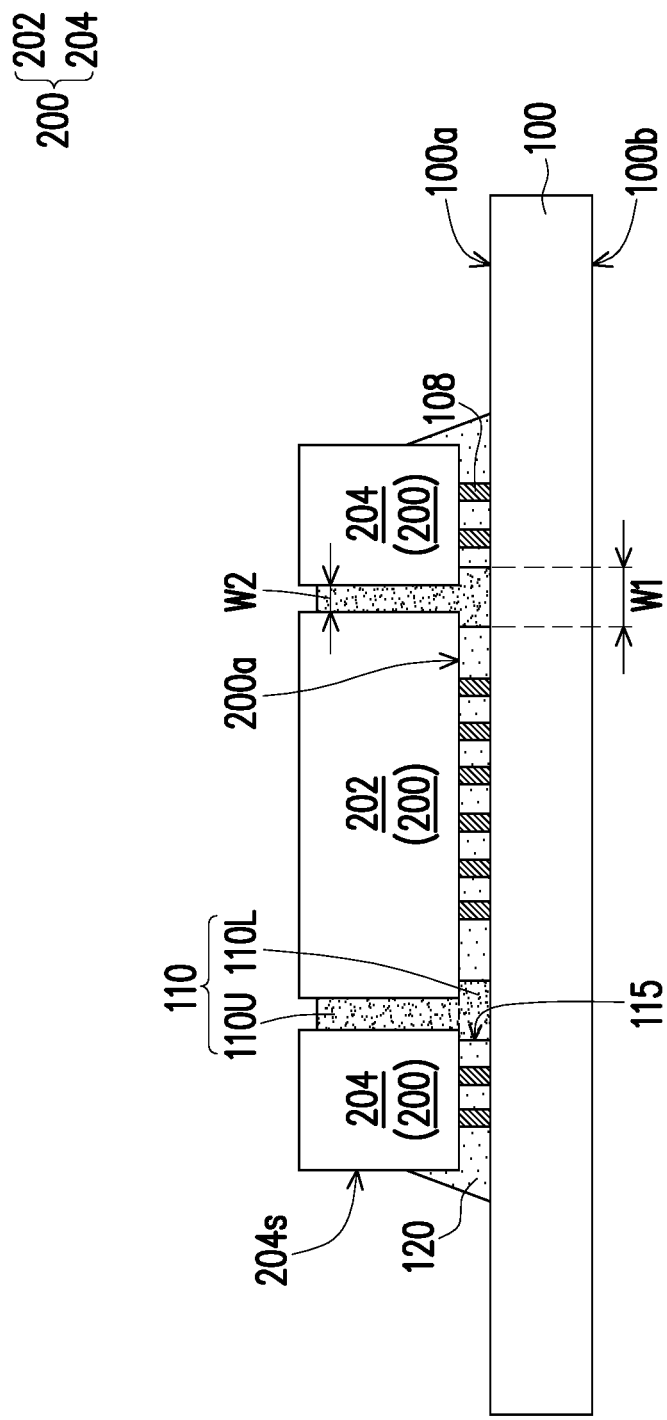
Figure 1D:
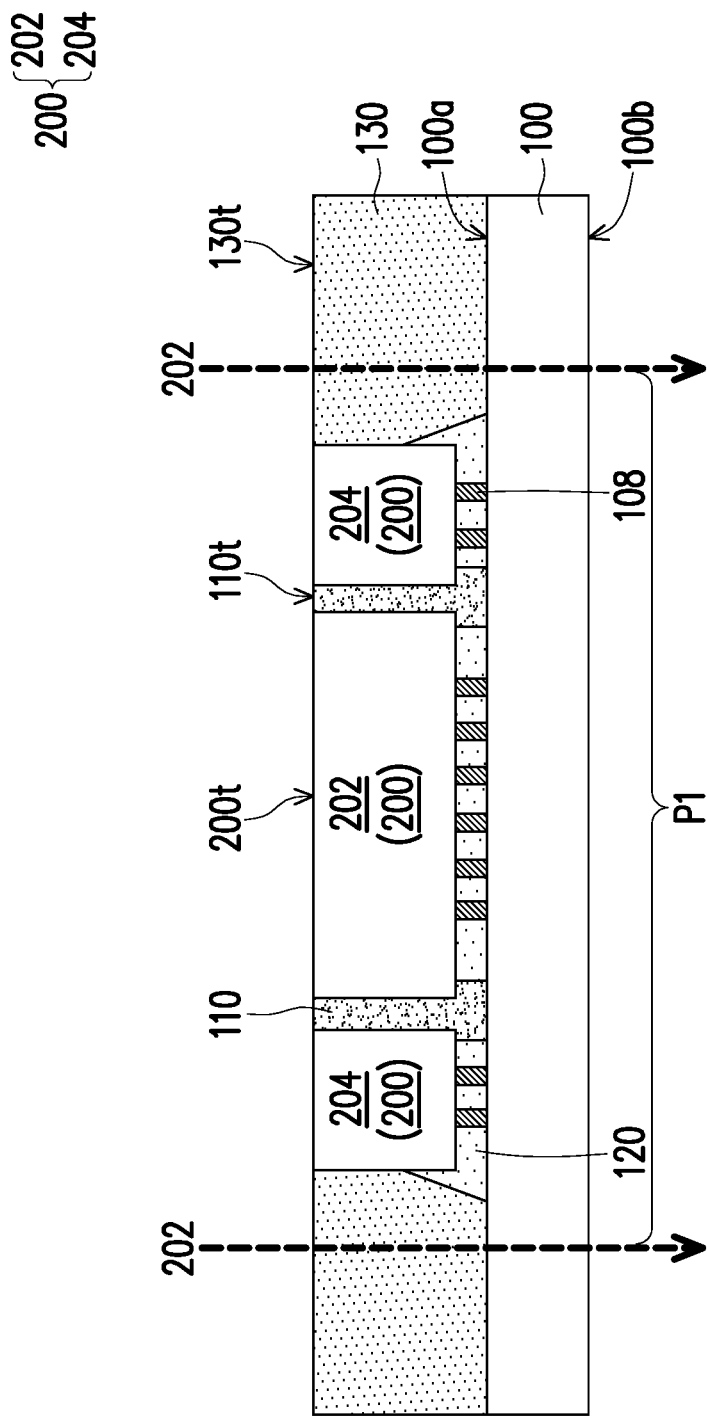
Figure 1E:
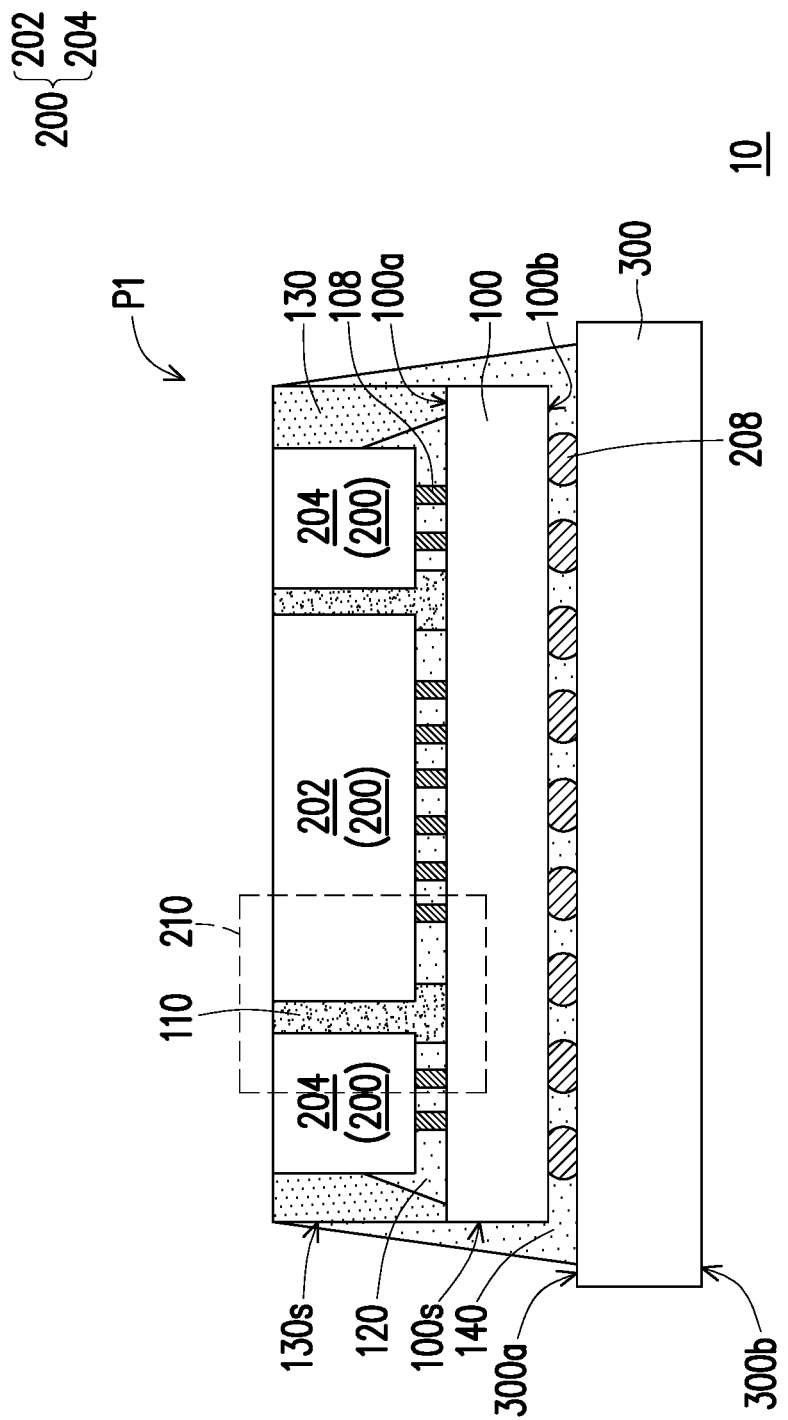

Referring to FIG. 1A, a method of forming a package structure 10 (as shown in FIG. 1E) includes following steps. First, an initial structure illustrated in FIG. 1A is provided. The initial structure includes an interposer 100 and a plurality of chips 200 bonded to the interposer 100 by a plurality of connectors 108.

Specifically, the interposer 100 may include a first surface 100a and a second surface 100b opposite to each other. In some embodiments, the interposer 100 includes a substrate 101 and a conductive path (not individually illustrated). The conductive path (e.g., through substrate vias (TSVs)) is embedded in the substrate 101 and extends from the first surface 100a to the second surface 100b. The substrate 101 may be, e.g., a silicon substrate, doped or undoped, or an active layer of a silicon-on-insulator (SOI) substrate. However, the substrate 101 may alternatively be a glass substrate, a ceramic substrate, a polymer substrate, or any other substrate that may provide a suitable protection and/or interconnection functionality. These and any other suitable materials may alternatively be used for the substrate 101.

In some embodiments, the substrate 101 may include electrical components, such as resistors, capacitors, signal distribution circuitry, combinations of these, or the like. These electrical components may be active, passive, or a combination thereof. In other embodiments, the substrate 101 is free from both active and passive electrical components therein. All such combinations are fully intended to be included within the scope of the embodiments.

Additionally, in some embodiments, the substrate 101 is a semiconductor wafer. As such, when one or more semiconductor chips, e.g., the chips 200, are bonded to the substrate 101, the combined structure may form a Chip-On-Wafer (CoW) configuration.

The conductive paths may be TSVs or any other suitable conductive paths. In some embodiments where conductive paths are TSVs, the TSVs may be formed by initially forming electrically conductive paths partially through the substrate 101, then thinning the substrate 101 later to expose the electrically conductive paths. In other embodiments, the conductive paths, when formed initially, extends through the substrate 101, and no thinning of the substrate 101 is needed. The conductive paths may be formed by forming a suitable photoresist or a hard mask on the substrate 101, patterning the photoresist or the hard mask, and then etching the substrate 101 to generate openings (e.g., TSV openings).

After forming the openings for the conductive paths, the openings may be filled with, e.g., a liner, a barrier layer, and a conductive material. In an embodiment, the liner may be a dielectric material, such as silicon nitride, silicon oxide, a dielectric polymer, combinations of these, or the like, formed by a process such as chemical vapor deposition, oxidation, physical vapor deposition, atomic layer deposition, or the like.

The barrier layer may include a conductive material such as titanium nitride, although other materials, such as tantalum nitride, titanium, another dielectric, or the like may alternatively be utilized. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used. The barrier layer may be formed so as to contour to the underlying shape of the opening for the conductive paths.

The conductive material may include copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the conductive paths. After filling in the openings for the conductive paths, excess barrier layer and excess conductive material outside of the openings may be removed through a grinding process, such as chemical mechanical polishing (CMP), although any suitable removal process may be used.

As shown in FIG. 1A, the chips 200 are disposed side by side and bonded onto the first surface 100a of the interposer 100 by the connectors 108. In detail, the chips 200 are upside down, so that front sides (or active surfaces) 200a of the chips 200 face toward the interposer 100. In the case, back sides 200b of the chips 200 are referred to as top surfaces 200t of the chips 200, while the front sides (or active surfaces) 200a of the chips 200 are referred to as bottom surface 200bt of the chips 200.

In some embodiments, the chips 200 may be logic chips (e.g., central processing unit, graphics processing unit, system-on-a-chip, microcontroller, etc.), memory chips (e.g., dynamic random access memory (DRAM) chip, static random access memory (SRAM) chip, etc.), power management chips (e.g., power management integrated circuit (PMIC) chip), radio frequency (RF) chips, sensor chips, micro-electro-mechanical-system (MEMS) chips, signal processing chips (e.g., digital signal processing (DSP) chip), front-end chips (e.g., analog front-end (AFE) chips), the like, or a combination thereof. In some alternative embodiments, the chips 200 may have different sizes, such as different heights and/or surface areas. For example, as shown in FIG. 1A, a center chip 202 has a wider width than a width of each of two periphery chips 204. However, the disclosure is not limited thereto, in other embodiments, the chips 200 may be the same size (e.g., same heights and/or surface areas). In an embodiment, the chips 200 may have the same function or different functions. For example, the center chip 202 is a system-on-a-chip (SoC) or a graphics processing unit (GPU), while the periphery chips 204 are memory chips, such as low-power (LP) double data rate (DDR) memory chips, DRAM chips, SRAM chips, High-Bandwidth Memory (HBM) chips, Hybrid Memory Cubes (HMC) chips, or the like.

Details of the chips 200 are described hereinafter. One of the chips 200 may include a substrate (not individually illustrated), electrical components on the substrate (not individually illustrated), metallization layers (not individually illustrated) over the substrate, a passivation layer (not individually illustrated) over the metallization layer, and conductive pads (not individually illustrated) over the passivation layer. In an embodiment, the substrate may be made of silicon or other semiconductor materials. Alternatively, or additionally, the substrate may include other elementary semiconductor materials such as germanium. In some embodiments, the substrate is made of a compound semiconductor such as silicon carbide, gallium arsenic, indium arsenide or indium phosphide. In some embodiments, the substrate is made of an alloy semiconductor such as silicon germanium, silicon germanium carbide, gallium arsenic phosphide, or gallium indium phosphide. Furthermore, the substrate may be a semiconductor on insulator such as silicon on insulator (SOI) or silicon on sapphire. Other substrates that may be used include multi-layered substrates, gradient substrates, or hybrid orientation substrates.

The electrical components include a wide variety of active devices (e.g., transistors) and passive devices (e.g., capacitors, resistors, inductors) and the like that may be used to generate the desired structural and functional requirements of the design for the chips 200. The electrical components may be formed using any suitable methods either within or else on the substrate of the chip 200.

The metallization layers are formed over the substrate and the electrical components and are designed to connect the various electrical components to form functional circuitry. In an embodiment, the metallization layers are formed of alternating layers of dielectric and conductive material and may be formed through any suitable process (such as deposition, single damascene, dual damascene, etc.). In an embodiment, the number of the metallization layers is dependent upon the design of the chips 200.

The passivation layer may be formed over the metallization layers in order to provide a degree of protection for the underlying structures. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

The conductive pads may be formed over and in electrical contact with the metallization layer. The conductive pads may include aluminum, but other materials, such as copper, may alternatively be used. The conductive pads may be formed using a deposition process, such as sputtering or plating, to form a layer of material (not shown) and portions of the layer of material may then be removed through a suitable process (such as photolithographic masking and etching) to form the conductive pads. However, any other suitable process may be utilized to form the conductive pads.

As shown in FIG. 1A, the connectors 108 may be formed between the conductive pads of the chips 200 and the TSVs of the interposer 100 to electrically connect to the chips and the interposer 100. In an embodiment, the connectors 108 may be contact bumps such as micro-bumps and may include a material such as tin, or other suitable materials, such as silver or copper. In an embodiment in which the connectors 108 are tin solder bumps, the connectors 108 may be formed by initially forming a layer of tin through any suitable method, such as evaporation, electroplating, printing, solder transfer, ball placement. After forming a layer of tin on the structure, a reflow is performed in order to shape the material into the desired bump shape.

However, as one of ordinary skill in the art will recognize, while the connectors 108 have been described above as micro-bumps, these are merely intended to be illustrative and are not intended to limit the embodiments. Rather, any suitable type of external contacts, such as controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the connectors 108, and all such external connectors are fully intended to be included within the scope of the embodiments.

Although not shown in FIG. 1A, a redistribution structure may be formed between the connectors 108 and the first surface 100a of the interposer 100, in order to provide electrical interconnectivity between the interposer 100 and the chips 200. The redistribution structure includes redistribution layers (RDLs) (e.g., conductive lines and/or vias) disposed in one or more dielectric layers of the redistribution structure. The redistribution structure may be formed using common methods for forming interconnect structures in integrated circuits, details are not repeated here.

After the chips 200 are picked and placed onto the first surface 100a of the interposer 100, the chip 200 may be bonded to the interposer 100 by using, e.g., a bonding process. For example, a reflow process may be performed to bond the connectors 108 with respective contact pads (not shown) on t the first surface 100a of the interposer 100.

Figure 2:
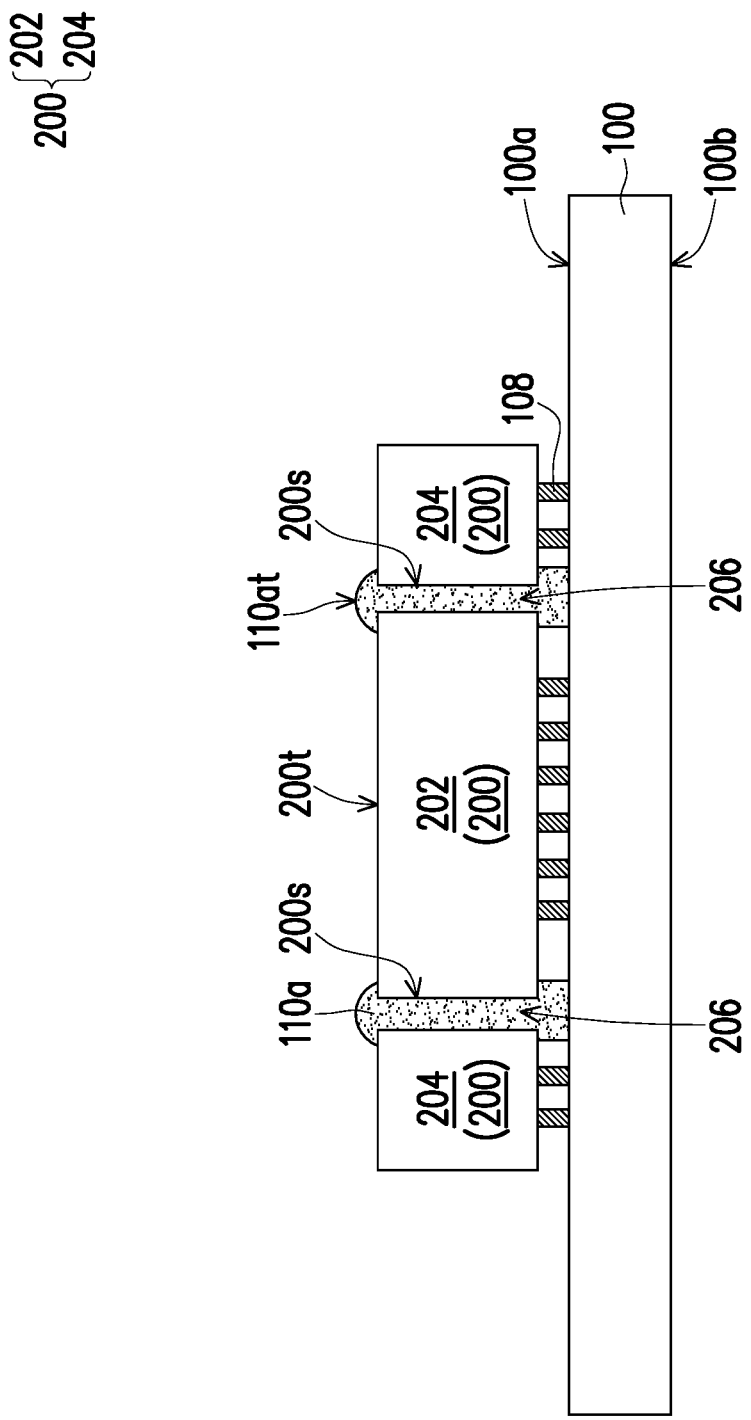
FIG. 2 is a cross-sectional view showing a package structure in accordance with a second embodiment.

Referring to FIG. 1A and FIG. 1B, after bonding the chips 200 onto the interposer 100, a first encapsulating material 110a is dispensed or filled into gaps 206 between the chips 200 by using a dispenser 150. In some embodiments, the first encapsulating material 110a may include an epoxy, an organic polymer, a polymer with or without a silica-based or glass filler added, or other materials, as examples. In some alternative embodiments, the first encapsulating material 110a includes a liquid molding compound (LMC) that is a gel type liquid when applied. Alternatively, the first encapsulating material 110a may include other insulating and/or encapsulating materials. In the case, as shown in FIG. 1B, the first encapsulating material 110a extends from the first surface 100a of the interposer 100 to the top surfaces 200t of the chips 200. In some embodiments, as shown in FIG. 1B, a top surface 110at of the first encapsulating material 110a is lower than the top surfaces 200t of the chips 200. However, the disclosure is not limited thereto, in other embodiments, the top surface 110at of the first encapsulating material 110a may be aligned with or higher than the top surfaces 200t of the chips 200. For example, as shown in FIG. 2, the first encapsulating material 110 protrudes from the gaps 206 between the chips 200 to cover a portion of the top surfaces 200t of the chips 200, so that the top surface 110at of the first encapsulating material 110a is higher than the top surfaces 200t of the chips 200.

In alternative embodiments, before dispensing the first encapsulating material 110a into the gaps 206 between the chips 200, a plasma treatment (e.g., 02 plasma treatment) is performed on the initial structure illustrated in FIG. 1A, so that sidewalls 200s of the chips 200 and the first surface 100a of the interposer 100 become more hydrophilic. Accordingly, the first encapsulating material 110a is easy to fill in the gaps 206 between the chips 200 and partially into spaces 216 between the chips 200 and the interposer 100. In the case, as shown in FIG. 1B, the first encapsulating material 110a extends to the spaces 216 and is in (physical) contact with a portion of the active surfaces 200a of the chips 200 and a portion of the first surface 100a of the interposer 100. In some embodiments, a width 206w of one of the gaps 206 is 100 μm to 200 μm and a height 216h of one of the spaces 216 is 700 μm to 900 μm. In one embodiment, the height 216h of one of the spaces 216 is greater than the width 206w of one of the gaps 206. However, the disclosure is not limited thereto, in another embodiment, the height 216h of one of the spaces 216 is less than or equal to the width 206w of one of the gaps 206.

Referring to FIG. 1B and FIG. 1C, after dispensing the first encapsulating material 110a, a second encapsulating material 120a is dispensed or filled into the spaces 216 between the chips 200 and the interposer 100 by using another dispenser 250. In some embodiments, the second encapsulating material 120a may include underfill material, such as a polymer, epoxy, molded underfill (MUF), or the like and may be formed by a capillary flow process or a suitable deposition method. For example, the second encapsulating material 120a is dispensed along edges 200e of the chips 200, the second encapsulating material 120a flows in the spaces 216 between the chips 200 and the interposer 100 due to the capillary action. In the case, as shown in FIG. 1C, the second encapsulating material 120a extends from the edges 200e of the chips 200 to encapsulate the connectors 108 and contact with the first encapsulating material 110a.

In some embodiments, a flow ability of the first encapsulating material 110a is less than a flowability of the second encapsulating material 120a. As such, the second encapsulating material 120a is able to fill in more narrow spaces 216 compared with the first encapsulating material 110a.

In FIG. 1C, after dispensing the second encapsulating material 120a, the first encapsulating material 110a and the second encapsulating material 120a are cured in a single curing step into a first encapsulant 110 and a second encapsulant 120. That is, the first encapsulant 110 and the second encapsulant 120 are simultaneously formed during the single curing step. In the case, the single curing step is more efficient and cost saving than multiple curing steps. In some embodiments, the curing step may include heating the first encapsulating material 110a and the second encapsulating material 120a to a predetermined temperature for a predetermined period of time, by using an anneal process or other heating process. A temperature of the curing step may be 100° C. to 150° C., and a process time of the curing step may be 60 minutes to 120 minutes. In some alternative embodiments, the curing step may include an ultra-violet (UV) light exposure process, an infrared (IR) energy exposure process, combinations thereof, or a combination thereof with a heating process. Alternatively, the first encapsulating material 110a and the second encapsulating material 120a may be cured by using other methods.

Figure 4:
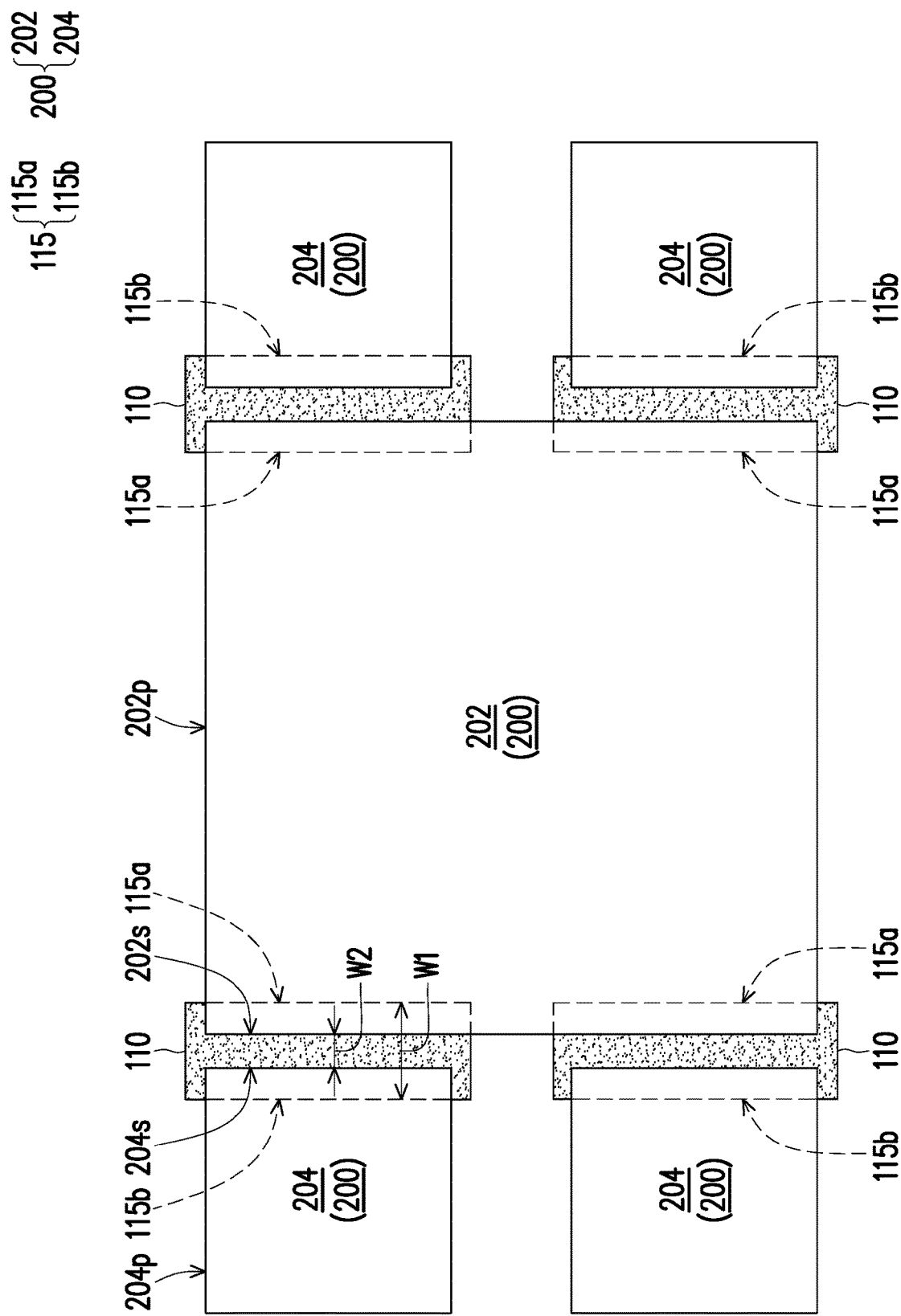
FIG. 4 is a top view showing a package structure in accordance with a third embodiment.

After the curing steps, as shown in FIG. 1C, the first encapsulant 110 is disposed between the chips 200 and extends to the first surface 100a of the interposer 100. The second encapsulant 120 encapsulates the connectors 108 and surrounds the chips 200. In addition, the second encapsulant 120 cover a portion of the sidewalls 204s of the periphery chips 204. In some embodiments, the second encapsulant 120 is in (physical) contact with the first encapsulant 110 with interfaces 115 there-between. The interfaces 115 extend from the active surfaces 200a of the chips 200 to the first surface 100a of the interposer 100. Specifically, as shown in FIG. 1C and the top view of FIG. 4, the second encapsulant 120 and the first encapsulant 110 are in contact under the chips 200. Therefore, one of the interfaces 115a is recessed from a sidewall 202s of the chip 202 within a perimeter 202p of the chip 202; and another of the interfaces 115b is recessed from a sidewall 204s of the chip 204 within a perimeter 204p of the chip 204. In the case, the first encapsulant 110 illustrated in FIG. 1C is referred to as an inversed T-shape. That is, the first encapsulant 110 may include a lower portion 110L and an upper portion 110U disposed over the lower portion 110L. A width W1 of the lower portion 110L is greater than a width W2 of the upper portion 110U.

It should be noted that a coefficient of thermal expansion (CTE) of the first encapsulant 110 is less than a CTE of the second encapsulant 120, in some embodiments. Accordingly, the first encapsulant 110 sandwiched between the chips 200 is able to reduce the warpage of the package structure resulting from the CTE mismatch of different materials of the package structure. For example, the first encapsulant 110 and/or the second encapsulant 120 has a higher CTE than that of the chips 200. As a result, the lower surface and/or the upper surface of the structure illustrated in FIG. 1C is warped (e.g., curved) instead of flat. In the present embodiment, the CTE of the first encapsulant 110 is between the CTE of the second encapsulant 120 and the CTE of the chips 200. Therefore, the first encapsulant 110 can prevent the warpage or stress by reducing the CTE mismatch between the second encapsulant 120 and the chips 200. In another embodiment, the CTE of the first encapsulant 110 is less than 20 ppm/° C., such as 8 ppm/° C. to 15 ppm/° C. The CTE of the second encapsulant 120 is greater than or equal to 20 ppm/° C., such as 20 ppm/° C. to 40 ppm/° C.

Referring to FIG. 1C and FIG. 1D, a third encapsulant 130 is formed on the first surface 100a of the interposer 100 to encapsulate the chips 200, the first encapsulant 110, and the second encapsulant 120. In some embodiments, the third encapsulant 130 may be a molding compound, epoxy, or the like, and may be applied by compression molding, transfer molding, or the like. In alternative embodiments, the third encapsulant 130 and the first encapsulant 110 may have a same material or different materials. The third encapsulant 130 and the second encapsulant 120 may have a same material or different materials. Another curing step is performed to cure the third encapsulant 130, wherein the curing may be a thermal curing, an Ultra-Violet (UV) curing, or the like. In some embodiments, a planarization process, such as a mechanical grinding process and/or a chemical mechanical polishing (CMP) process, may be performed to remove excess portions of the third encapsulant 130, which excess portions are over the top surfaces 200t of chips 200 after the curing step. Accordingly, after the planarization process, the top surfaces 200t of chips 200 are substantially coplanar with the top surface 130t of the third encapsulant 130 and the top surface 110t of the first encapsulant 110.

After forming the third encapsulant 130, as shown in FIG. 1D, a singulation process 202 is performed to divide the structure illustrated in FIG. 1D into a plurality of packages P1. In some embodiments, the singulation process 202 may include a dicing process with a rotating blade and/or a laser beam to cut through the third encapsulant 130 and the interposer 100. In the case, as shown in FIG. 1E, sidewalls 130s of the third encapsulant 130 are substantially vertically aligned with sidewalls 100s of the interposer 100. After the singulation process 202, each package P1 may have the chips 200 disposed side by side on the first surface 100a of the interposer 100 and electrically connected to the interposer 100 by the connectors 108, the first encapsulant 110 disposed between the chips 200, the second encapsulant 120 encapsulating the connectors 108 and surrounding the chips 200, and the third encapsulant 130 laterally encapsulating the chips 200, the first encapsulant 110, and the second encapsulant 120. Although only three chips 200 are included in the package P1 of FIG. 1D, the disclosure is not limited thereto. In other embodiments, the number or the arrangement of the chips 200 are adjusted by the need.

Referring to FIG. 1D and FIG. 1E, the package P1 is bonded on a circuit substrate 300 by a plurality of connectors 208 to form the package structure 10. In the case, as shown in FIG. 1E, the connectors 208 are disposed between the second surface 100b of the interposer 100 and an upper surface 300a of the circuit substrate 300, and electrically connected the interposer 100 and the circuit substrate 300. In some embodiments, the circuit substrate 300 may include a package substrate, such as a build-up substrate including a core therein, a laminate substrate including a plurality of laminated dielectric films, a PCB, or the like. The circuit substrate 300 may include electrical connectors (not shown), such as solder balls, disposed on a lower surface 300b of the circuit substrate 300 to allow the circuit substrate 300 to be mounted to another device. In addition, a fourth encapsulant 140 may be optionally dispensed between the package P1 and the circuit substrate 300 and laterally encapsulating the connectors 208. In some embodiments, the fourth encapsulant 140 may cover the sidewalls 100s of the interposer 100 and further extend to cover the sidewalls 130s of the third encapsulant 130, as shown in FIG. 1E. The fourth encapsulant 140 may be any acceptable material, such as a polymer, epoxy, molded underfill, or the like. In some embodiments, the connectors 208 may include C4 bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the connectors 208, and all such external connectors are fully intended to be included within the scope of the embodiments. In some alternative embodiments, a size (e.g., a width) of the connectors 208 may be greater than a size (e.g., a width) of the connectors 108.

As such, when one or more packages P1 are bonded to the circuit substrate 300, the combined structure (e.g., the package structure 10) may form a Chip-on-Wafer-on-Substrate (CoWoS) configuration.

Alternatively, one or more surface devices (not shown) may be connected to the circuit substrate 300. The surface devices may be used to provide additional functionality or programming to the package P1, or the package structure 10 as a whole. In an embodiment, the surface devices may include surface mount devices (SMDs) or integrated passive devices (IPDs) that include passive devices such as resistors, inductors, capacitors, jumpers, combinations of these, or the like that are desired to be connected to and utilized in conjunction with the package P1 or the package structure 10.

In view of the foregoing, the package structure 10 including the first encapsulant 110 with a lower CTE that fills between the chips 200, so as to reduce the warpage of the package structure 10 resulting from the CTE mismatch. This reduction of the warpage of the package structure 10 decreases the likelihood of cold joints between the interposer 100 and the circuit substrate 300, thereby enhancing the reliability of the package structure 10 and increasing the joint window. In some embodiments, compared with a conventional package structure, the warpage of the package structure 10 is about 29% reduction. In the case, all of the connectors 208 of the package structure 10 are in contact with the package P1 and the circuit substrate 300, thereby forming a reliable bonding (e.g., electrical connection) between the package P1 and the circuit substrate 300.

Figure 3:
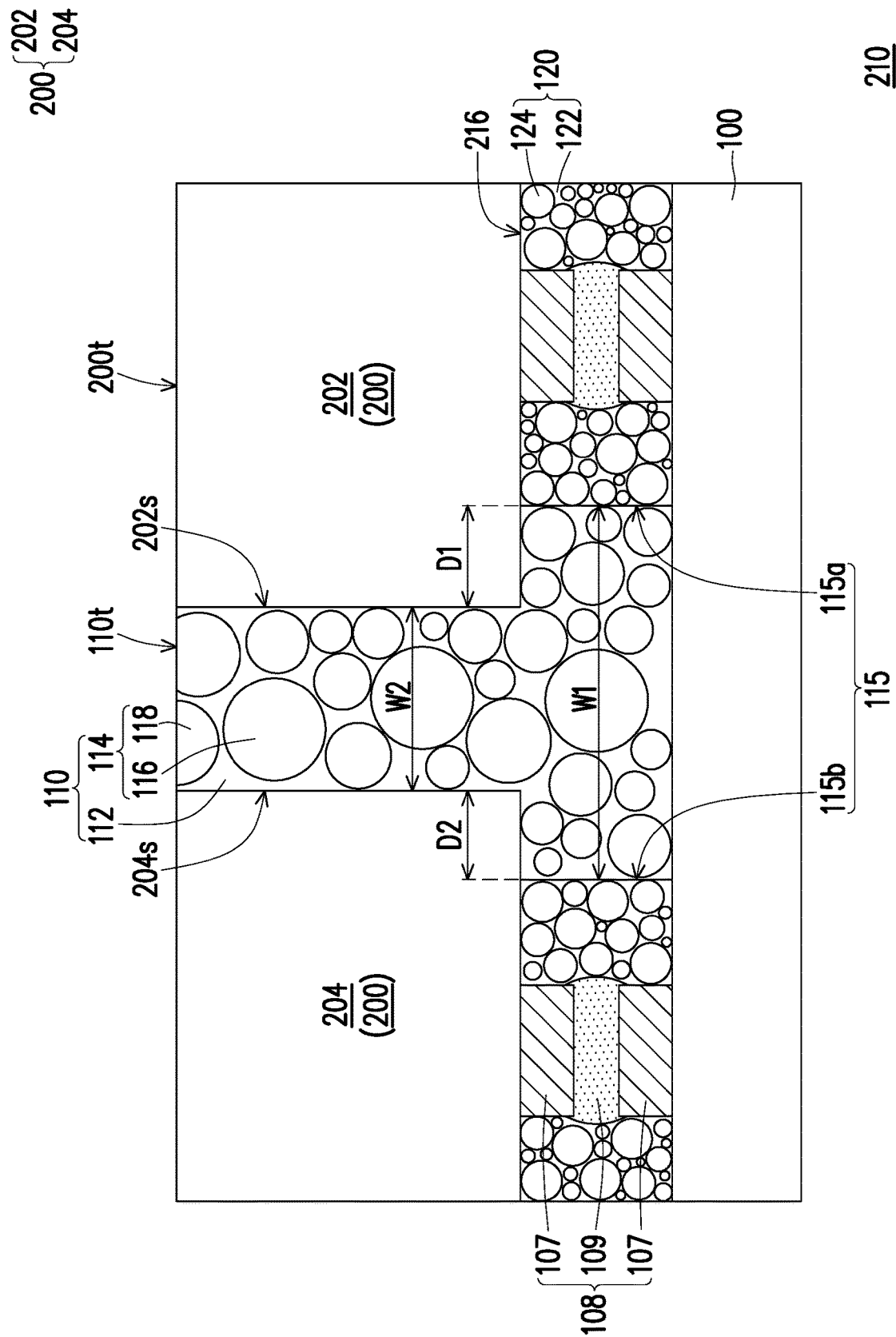
FIG. 3 is an enlarged view of a portion of the package structure showing in FIG. 1E.

FIG. 3 is an enlarged view of a portion 210 of the package structure 10 showing in FIG. 1E.

Referring to FIG. 1E and FIG. 3, the first encapsulant 110 extends toward the connectors 108 under the chips 202 and 204 to contact with the second encapsulant 120 with the interfaces 115 there-between. The interfaces 115 may include an interface 115a contacting with the chip 202 and an interface 115b contacting with the chips 204. In some embodiments, a distance D1 between the interface 115a and the sidewall 202s of the chip 202 is 20 µm to 200 µm, and a distance D2 between the interface 115b and the sidewall 204s of the chip 204 is 20 µm to 200 µm. In some alternative embodiments, the distances D1 and D2 may be the same or different. The first encapsulant 110 illustrated in FIG. 3 does not being in (physical) contact with the connectors 108. However, the disclosure is not limited thereto, in other embodiments, the first encapsulant 110 may be in (physical) contact with the connectors 108.

From another perspective, as shown in FIG. 3, the first encapsulant 110 may include a base material 112 and first fillers 114 in the base material 112. In some embodiments, the base material 112 may be a polymer, a resin, an epoxy, or the like; and the first fillers 114 may be dielectric particles of $SiO_2$, $Al_2O_3$, silica, or the like. In some alternative embodiments, the first fillers 114 may be solid or hollow dielectric particles. In addition, the first fillers 114 may include a plurality of spherical particles 116 and a plurality of partial particles 118. In some embodiments, the spherical particles 116 may have a plurality of different diameters. In other embodiments, an average dimension of the first fillers 114 is 0.3 µm to 20 µm, and a content of the first fillers 114 in the first encapsulant 110 is 65 wt % to 85 wt %.

It should be noted that, in some embodiments, since a portion of the first encapsulant 110 facing the chips 200 is not planarized through CMP or mechanical grinding, the spherical particles 116 in contact with the sidewall 200s of the chips 200 have spherical surfaces. In some alternative embodiments, the spherical particles 116 in contact with the interfaces 115 also have spherical surfaces. As a comparison, another portion of the first encapsulant 110 exposed by the top surface 110t of the first encapsulant 110 has been planarized in the step shown in FIG. 1D. Accordingly, the first fillers 114 exposed by the top surface 110t of the first encapsulant 110 are partially cut during the planarization, and hence will have substantially planar top surfaces (rather than rounded top surfaces) exposed by the top surface 110t of the first encapsulant 110. Inner spherical particles 116 not subjected to the planarization, on the other hand, remain to have the original shapes with non-planar (such as spherical) surfaces. Throughout the description, the first fillers 114 that have been polished in the planarization are referred to as partial particles 118.

Similarly, the second encapsulant 120 may include a base material 122 and second fillers 124 in the base material 122. In some embodiments, the base material 122 may be a polymer, a resin, an epoxy, or the like; and the second fillers 124 may be dielectric particles of $SiO_2$, $Al_2O_3$, silica, or the like. In some alternative embodiments, the second fillers 124 may be solid or hollow dielectric particles. Since the second encapsulant 120 does not suffer the planarization process, the second fillers 124 may include a plurality of spherical particles instead of partial particles. In other embodiments, an average dimension of the second fillers 124 is 0.3 µm to 10 µm, and a content of the second fillers 124 in the second encapsulant 120 is 50 wt % to 70 wt %. In the present embodiment, the average dimension of the first fillers 114 is greater than the average dimension of the second fillers 124, and the content of the first fillers 114 in the first encapsulant 110 is greater than the content of the second fillers 124 in the second encapsulant 120. That is, the second encapsulant 120 is more easy to fill in the small spaces 216 between the chips 200 and the interposer 100 than the first encapsulant 110. Further, an example of the connector 108 is a micro-bump illustrated in FIG. 3, the connector 108 may include two metal posts 107 (e.g., Cu posts) and a solder 109 disposed there-between.

Figure 5A:
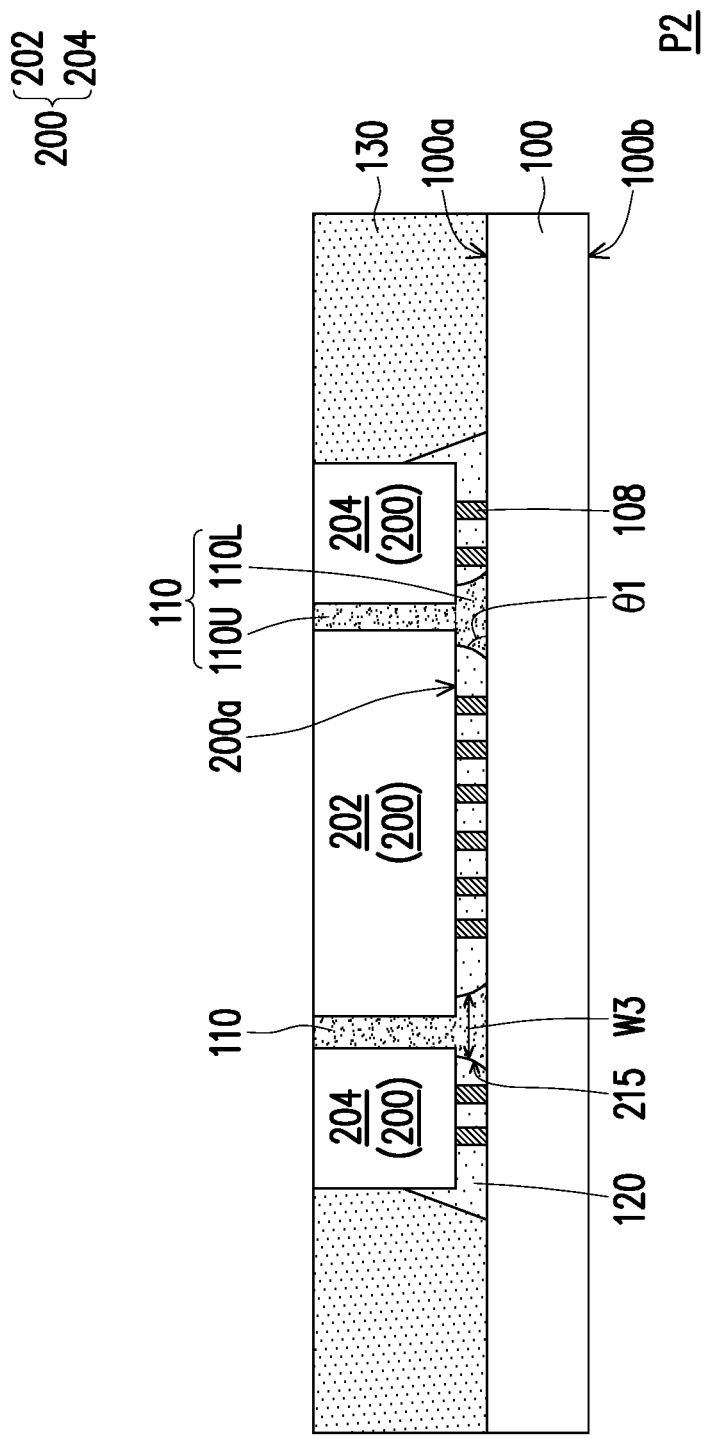
FIG. 5A to FIG. 5C are cross-sectional views of package in accordance with various embodiments.
Figure 5B:
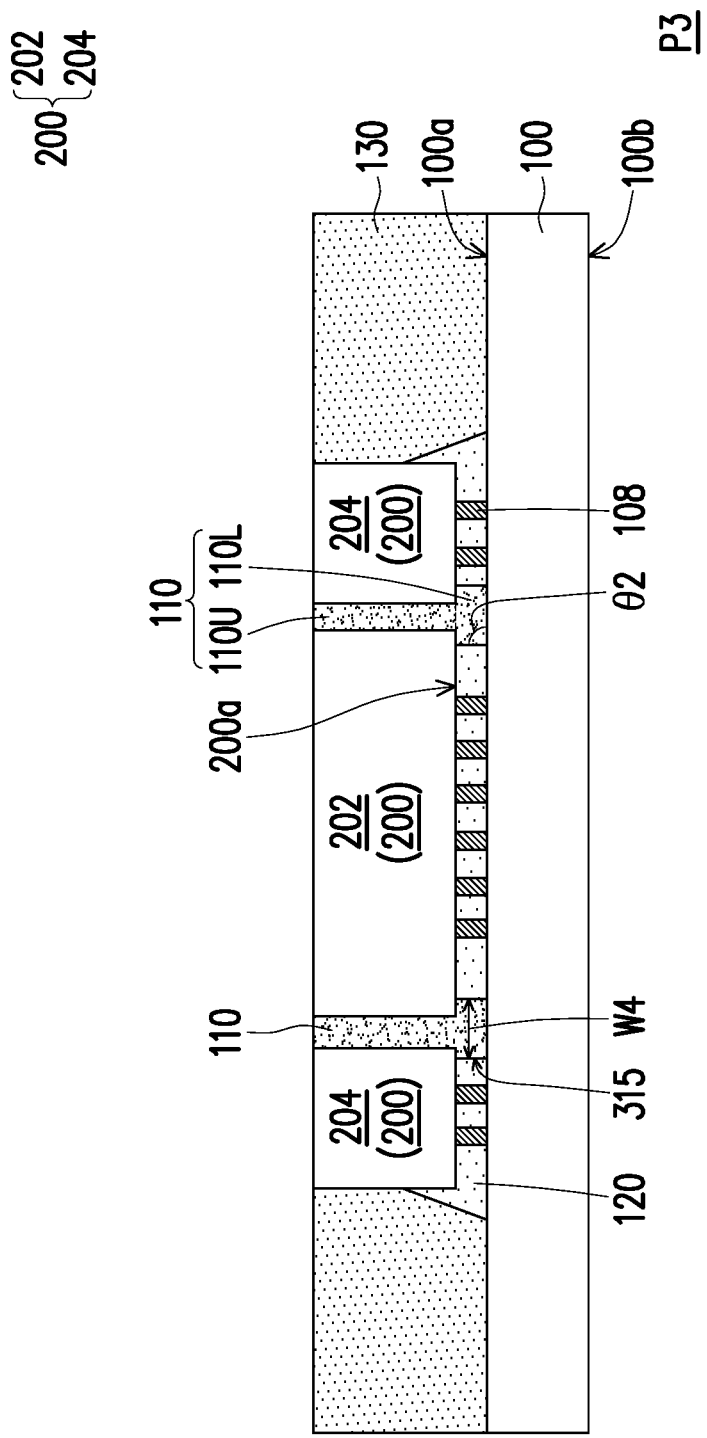
Figure 5C:
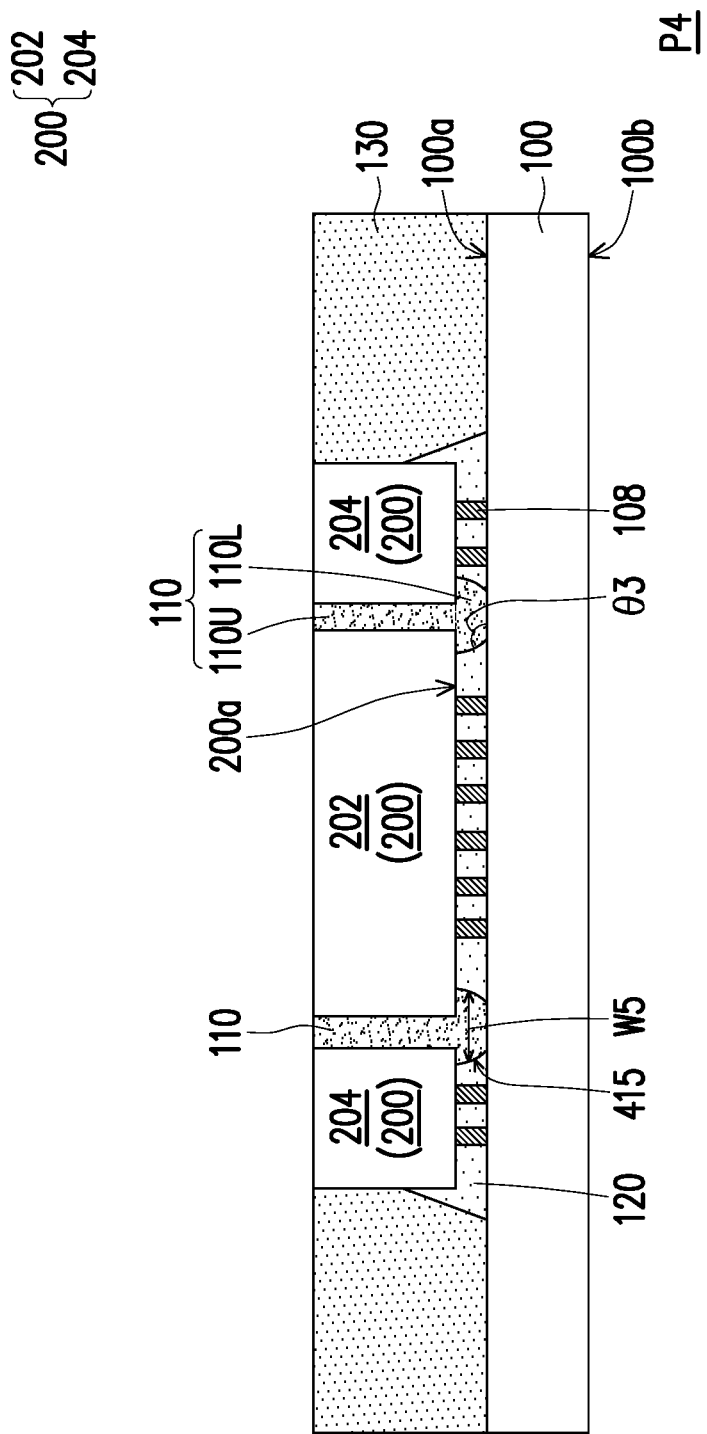

FIG. 5A to FIG. 5C are cross-sectional views of package in accordance with various embodiments.

Referring to FIG. 5A, the arrangement, material and forming method of a package P2 are similar to the arrangement, material and forming method of the package P1 illustrated in FIG. 1E and has been described in detail in the above embodiments. Thus, details thereof are omitted here. A difference there-between lies in that interfaces 215 of the package P2 are curved or tilt. In detail, a sharp angle θ1 is between the interface 215 and the first surface 100a of the interposer 100, so that the lower portion 110L of the first encapsulant 110 presents a trapezoid shape in the cross-sectional view. In other words, a width W3 of the lower portion 110L is tapered or gradually decreases from the first surface 100a of the interposer 100 to the active surface 200a of the chips 200. However, the disclosure is not limited thereto. In other embodiments, as shown in a package P3 of FIG. 5B, an included angle θ2 between an interface 315 and the first surface 100a of the interposer 100 is orthogonal. In the case, the lower portion 110L of the first encapsulant 110 presents a rectangle shape. Namely, the lower portion 110L of the first encapsulant 110 has a substantially uniform width W4 from the first surface 100a of the interposer 100 to the active surface 200a of the chips 200. In some alternative embodiments, interfaces 415 of the package P4 are curved or tilt. In detail, an obtuse angle θ3 is between the interface 415 and the first surface 100a of the interposer 100, so that the lower portion 110L of the first encapsulant 110 presents an inversed trapezoid shape in the cross-sectional view. That is, a width W5 of the lower portion 110L is tapered or gradually decreases from the active surface 200a of the chips 200 to the first surface 100a of the interposer 100.

According to some embodiments, a package structure includes at least two chips, an interposer, a first encapsulant, and a second encapsulant. The at least two chips are disposed side by side and bonded to the interposer by a plurality of connectors. The first encapsulant is disposed on the interposer and filling in a gap between the at least two chips. The second encapsulant encapsulates the plurality of connectors and surrounding the at least two chips, wherein the second encapsulant is in contact with the first encapsulant sandwiched between the at least two chips, and a material of the second encapsulant has a coefficient of thermal expansion (CTE) larger than a CTE of a material of the first encapsulant.

According to some embodiments, a package structure includes an interposer, a plurality of chips, a first encapsulant, and a second encapsulant. the interposer has a first surface and the second surface opposite to each other. The chips are disposed side by side on the first surface of the interposer and electrically connected to the interposer by a plurality of connectors. The first encapsulant is disposed between the chips and extending to the first surface of the interposer. The second encapsulant encapsulates the connectors and surrounding the chips, wherein the second encapsulant is in contact with the first encapsulant with interfaces there-between.

According to some embodiments, a method of manufacturing a package structure includes: providing an interposer having a first surface and the second surface opposite to each other; disposing and bonding a plurality of chips onto the first surface of the interposer through a plurality of first connectors; providing a first encapsulating material into gaps between the plurality of chips; providing a second encapsulating material into spaces between the plurality of chips and the interposer to encapsulate the plurality of first connectors, wherein the second encapsulating material is different from the first encapsulating material; and curing the first encapsulating material and the second encapsulating material in a single curing step into a first encapsulant and a second encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    at least two chips, disposed side by side and bonded to an interposer by a plurality of connectors;
    a first encapsulant, disposed on a top surface of the interposer and filling in a gap between the at least two chips, wherein the first encapsulant extends on active surfaces of the at least two chips and extends to the top surface of the interposer; and
    a second encapsulant, encapsulating and being in physical contact with the plurality of connectors, and surrounding the at least two chips, wherein the second encapsulant is in contact with the first encapsulant sandwiched between the at least two chips, and a material of the second encapsulant has a coefficient of thermal expansion (CTE) larger than a CTE of a material of the first encapsulant,
    wherein the second encapsulant has an extending portion protruding from sidewalls of the at least two chips, the extending portion is in contact with a lower portion of the sidewalls of the at least two chips, and the extending portion covers outer corners of the at least two chips.

2. The package structure of claim 1, further comprising a third encapsulant, laterally encapsulating the at least two chips, the first encapsulant, and the second encapsulant, wherein top surfaces of the at least two chips are substantially coplanar with top surfaces of the third encapsulant and the first encapsulant,
    wherein the extending portion of the second encapsulant has an inclined sidewall connecting the lower portion of the sidewalls of the at least two chips and the top surface of the interposer, and the third encapsulant is in contact with the inclined sidewall.

3. The package structure of claim 2, wherein the first encapsulant, the second encapsulant, and the third encapsulant have different materials.

4. The package structure of claim 2, wherein sidewalls of the third encapsulant are substantially vertically aligned with sidewalls of the interposer, and the third encapsulant is in contact with a portion of the top surface of the interposer.

5. The package structure of claim 1, wherein the first encapsulant comprises first fillers, the second encapsulant comprises second fillers and a content of the first fillers in the first encapsulant is greater than a content of the second fillers in the second encapsulant.

6. The package structure of claim 1, wherein the plurality of connectors is located between the active surfaces of the at least two chips and the top surface of the interposer, and the first encapsulant has a bottom width greater than a top width thereof.

7. The package structure of claim 1, wherein an interface that the second encapsulant is in contact with the first encapsulant is curved.

8. The package structure of claim 7, wherein an angle between the interface and the top surface of the interposer is an acute angle or an obtuse angle.

9. A package structure, comprising:
    an interposer, having a first surface and the second surface opposite to each other;
    a plurality of chips, disposed side by side on the first surface of the interposer and electrically connected to the interposer by a plurality of connectors;
    a first encapsulant, disposed between the plurality of chips and extending on active surfaces of the plurality of chips and extending to the first surface of the interposer; and
    a second encapsulant, encapsulating the plurality of connectors, and surrounding the plurality of chips, wherein the second encapsulant is in contact with the first encapsulant, and the first encapsulant is spaced from the plurality of connectors by a portion of the second encapsulant, wherein the second encapsulant has an extending portion protruding from sidewalls of the plurality of chips, the extending portion is in contact with a lower portion of the sidewalls of the plurality of chips, and the extending portion has an inclined sidewall connecting the lower portion of the sidewalls of the plurality of chips and the first surface of the interposer.

10. The package structure of claim 9, wherein a coefficient of thermal expansion (CTE) of the first encapsulant is less than a CTE of the second encapsulant.

11. The package structure of claim 9, wherein the first encapsulant comprises first fillers, the second encapsulant comprises second fillers and a content of the first fillers in the first encapsulant is greater than a content of the second fillers in the second encapsulant.

12. The package structure of claim 11, wherein an average dimension of the first fillers is greater than an average dimension of the second fillers.

13. The package structure of claim 9, wherein the first encapsulant is located between two most adjacent chips of the plurality of chips, and is in physical contact with active surfaces of the two most adjacent chips.

14. The package structure of claim 9, further comprising:
a third encapsulant, laterally encapsulating the plurality of chips, the first encapsulant, and the second encapsulant, wherein top surfaces of the plurality of chips are substantially coplanar with top surfaces of the third encapsulant and the first encapsulant.

15. The package structure of claim 9, further comprising:
a circuit substrate, bonded onto the second surface of the interposer and electrically connected to the plurality of chips through the plurality of connectors and the interposer.

16. The package structure of claim 9, wherein the plurality of chips comprises:
a center chip having a sidewall connecting an upper perimeter and a lower perimeter opposite to each other; and
a plurality of periphery chips, wherein the center chip is disposed between the plurality of periphery chips, a width of the center chip is greater than a width of each periphery chip, and a portion of the first encapsulant between the sidewall of the center chip and a sidewall of a corresponding periphery chip extends beyond the upper or lower perimeter of the center chip in a top view.

17. A method of manufacturing a package structure, comprising:
providing an interposer having a first surface and the second surface opposite to each other;
disposing and bonding a plurality of chips onto the first surface of the interposer through a plurality of first connectors;
providing a first encapsulating material into gaps between the plurality of chips;
providing a second encapsulating material into spaces between the plurality of chips and the interposer to encapsulate the plurality of first connectors, wherein the second encapsulating material is different from the first encapsulating material; and
curing the first encapsulating material and the second encapsulating material in a single curing step into a first encapsulant and a second encapsulant, wherein the first encapsulant is in contact with the second encapsulant, and the first encapsulant is spaced from the plurality of connectors by a portion of the second encapsulant, wherein the first encapsulant extends on active surfaces of the plurality of chips and extends to the first surface of the interposer,
wherein the second encapsulant has an extending portion protruding from sidewalls of the plurality of chips, the extending portion is in contact with a lower portion of the sidewalls of the plurality of chips, and the extending portion has an inclined sidewall connecting the lower portion of the sidewalls of the plurality of chips and the first surface of the interposer.

18. The method of claim 17, wherein a flowability of the first encapsulating material is less than a flowability of the second encapsulating material.

19. The method of claim 17, wherein a coefficient of thermal expansion (CTE) of the first encapsulant is less than a CTE of the second encapsulant.

20. The method of claim 17, further comprising:
forming a third encapsulant over the interposer to laterally encapsulate the plurality of chips, the first encapsulant, and the second encapsulant;
performing a dicing process to cut through the third encapsulant into a plurality of packages; and
bonding the plurality of packages onto a circuit substrate.

* * * * *